(12) United States Patent  (10) Patent No.: US 9,280,998 B1
Tan et al.                     (45) Date of Patent:    Mar. 8, 2016

(54) ACIDIC POST-SPUTTER WASH FOR MAGNETIC RECORDING MEDIA

(71) Applicant: WD Media, LLC, San Jose, CA (US)

(72) Inventors: Hooi In Tan, Singapore (SG); Chin Hoe Teoh, Penang (MY)

(73) Assignee: WD Media, LLC, San Jose, CA (US)

( * ) Notice: Subject to any disclaimer, the term of this patent is extended or adjusted under 35 U.S.C. 154(b) by 0 days.

(21) Appl. No.: 14/673,676

(22) Filed: Mar. 30, 2015

(51) Int. Cl.
G11B 5/66    (2006.01)
G11B 5/851   (2006.01)
C23C 14/58   (2006.01)
G11B 5/667   (2006.01)

(52) U.S. Cl.
CPC ............ G11B 5/851 (2013.01); C23C 14/5873 (2013.01); G11B 5/667 (2013.01)

(58) Field of Classification Search
CPC ........... G11B 5/66; G11B 5/667; G11B 5/851
USPC ............ 360/97.1, 97.01, 97.02; 428/212, 336
See application file for complete search history.

(56) References Cited

U.S. PATENT DOCUMENTS

| | | | |
|---|---|---|---|
| 4,472,337 A * | 9/1984 | Huck et al. | 264/107 |
| 5,505,785 A | 4/1996 | Ferrell | |
| 5,660,640 A | 8/1997 | Laube | |
| 6,013,161 A | 1/2000 | Chen et al. | |
| 6,063,248 A | 5/2000 | Bourez et al. | |
| 6,068,891 A | 5/2000 | O'Dell et al. | |
| 6,086,730 A | 7/2000 | Liu et al. | |
| 6,099,981 A | 8/2000 | Nishimori | |
| 6,103,300 A | 8/2000 | Yoshida et al. | |
| 6,103,404 A | 8/2000 | Ross et al. | |
| 6,117,499 A | 9/2000 | Wong et al. | |
| 6,136,403 A | 10/2000 | Prabhakara et al. | |
| 6,143,375 A | 11/2000 | Ross et al. | |
| 6,145,849 A | 11/2000 | Bae et al. | |
| 6,146,737 A | 11/2000 | Malhotra et al. | |
| 6,149,696 A | 11/2000 | Jia | |
| 6,150,015 A | 11/2000 | Bertero et al. | |
| 6,156,404 A | 12/2000 | Ross et al. | |
| 6,159,076 A | 12/2000 | Sun et al. | |
| 6,164,118 A | 12/2000 | Suzuki et al. | |
| 6,200,441 B1 | 3/2001 | Gornicki et al. | |
| 6,204,995 B1 | 3/2001 | Hokkyo et al. | |
| 6,206,765 B1 | 3/2001 | Sanders et al. | |
| 6,210,819 B1 | 4/2001 | Lal et al. | |
| 6,216,709 B1 | 4/2001 | Fung et al. | |
| 6,221,119 B1 | 4/2001 | Homola | |
| 6,248,395 B1 | 6/2001 | Homola et al. | |
| 6,261,681 B1 | 7/2001 | Suekane et al. | |
| 6,270,885 B1 | 8/2001 | Hokkyo et al. | |

(Continued)

FOREIGN PATENT DOCUMENTS

JP      2009084644 A  *  4/2009

*Primary Examiner* — Allen T Cao

(57) ABSTRACT

A recording medium having an outer surface relatively free of magnetic particulates is achievable by, after forming a magnetic recording layer with which magnetic contamination is associated, removing magnetic contamination from the medium by immersing the medium in an acidic water solution. For example, a post-sputter wash process utilizing a mildly acidic water solution having a pH less than around 5 may remove cobalt particle contaminants from the surface of the medium. The water solution may be acidized by introducing into deionized water a pre-diluted strong acid such as nitric acid or a weak acid such as carbonic acid.

20 Claims, 3 Drawing Sheets

(56) References Cited

U.S. PATENT DOCUMENTS

| | | |
|---|---|---|
| 6,274,063 B1 | 8/2001 | Li et al. |
| 6,283,838 B1 | 9/2001 | Blake et al. |
| 6,287,429 B1 | 9/2001 | Moroishi et al. |
| 6,290,573 B1 | 9/2001 | Suzuki |
| 6,299,947 B1 | 10/2001 | Suzuki et al. |
| 6,303,217 B1 | 10/2001 | Malhotra et al. |
| 6,309,765 B1 | 10/2001 | Suekane et al. |
| 6,358,636 B1 | 3/2002 | Yang et al. |
| 6,362,452 B1 | 3/2002 | Suzuki et al. |
| 6,363,599 B1 | 4/2002 | Bajorek |
| 6,365,012 B1 | 4/2002 | Sato et al. |
| 6,381,090 B1 | 4/2002 | Suzuki et al. |
| 6,381,092 B1 | 4/2002 | Suzuki |
| 6,387,483 B1 | 5/2002 | Hokkyo et al. |
| 6,391,213 B1 | 5/2002 | Homola |
| 6,395,349 B1 | 5/2002 | Salamon |
| 6,403,919 B1 | 6/2002 | Salamon |
| 6,408,677 B1 | 6/2002 | Suzuki |
| 6,426,157 B1 | 7/2002 | Hokkyo et al. |
| 6,429,984 B1 | 8/2002 | Alex |
| 6,482,330 B1 | 11/2002 | Bajorek |
| 6,482,505 B1 | 11/2002 | Bertero et al. |
| 6,500,567 B1 | 12/2002 | Bertero et al. |
| 6,528,124 B1 | 3/2003 | Nguyen |
| 6,548,821 B1 | 4/2003 | Treves et al. |
| 6,552,871 B2 | 4/2003 | Suzuki et al. |
| 6,565,719 B1 | 5/2003 | Lairson et al. |
| 6,566,674 B1 | 5/2003 | Treves et al. |
| 6,571,806 B2 | 6/2003 | Rosano et al. |
| 6,582,279 B1 | 6/2003 | Fox et al. |
| 6,628,466 B2 | 9/2003 | Alex |
| 6,664,503 B1 | 12/2003 | Hsieh et al. |
| 6,670,055 B2 | 12/2003 | Tomiyasu et al. |
| 6,682,807 B2 | 1/2004 | Lairson et al. |
| 6,683,754 B2 | 1/2004 | Suzuki et al. |
| 6,692,588 B1 | 2/2004 | Uzoh et al. |
| 6,730,420 B1 | 5/2004 | Bertero et al. |
| 6,743,528 B2 | 6/2004 | Suekane et al. |
| 6,759,138 B2 | 7/2004 | Tomiyasu et al. |
| 6,764,552 B1 | 7/2004 | Joyce et al. |
| 6,778,353 B1 | 8/2004 | Harper |
| 6,795,274 B1 | 9/2004 | Hsieh et al. |
| 6,821,350 B2 | 11/2004 | Krogh |
| 6,855,232 B2 | 2/2005 | Jairson et al. |
| 6,857,937 B2 | 2/2005 | Bajorek |
| 6,864,187 B2 | 3/2005 | Tomimori et al. |
| 6,893,748 B2 | 5/2005 | Bertero et al. |
| 6,899,959 B2 | 5/2005 | Bertero et al. |
| 6,916,558 B2 | 7/2005 | Umezawa et al. |
| 6,939,120 B1 | 9/2005 | Harper |
| 6,946,191 B2 | 9/2005 | Morikawa et al. |
| 6,967,798 B2 | 11/2005 | Homola et al. |
| 6,972,135 B2 | 12/2005 | Homola |
| 7,004,827 B1 | 2/2006 | Suzuki et al. |
| 7,006,323 B1 | 2/2006 | Suzuki |
| 7,016,154 B2 | 3/2006 | Nishihira |
| 7,019,924 B2 | 3/2006 | McNeil et al. |
| 7,045,215 B2 | 5/2006 | Shimokawa |
| 7,067,015 B2 | 6/2006 | Xia et al. |
| 7,070,870 B2 | 7/2006 | Bertero et al. |
| 7,090,934 B2 | 8/2006 | Hokkyo et al. |
| 7,099,112 B1 | 8/2006 | Harper |
| 7,105,241 B2 | 9/2006 | Shimokawa et al. |
| 7,119,990 B2 | 10/2006 | Bajorek et al. |
| 7,147,790 B2 | 12/2006 | Wachenschwanz et al. |
| 7,161,753 B2 | 1/2007 | Wachenschwanz et al. |
| 7,166,319 B2 | 1/2007 | Ishiyama |
| 7,166,374 B2 | 1/2007 | Suekane et al. |
| 7,169,487 B2 | 1/2007 | Kawai et al. |
| 7,174,775 B2 | 2/2007 | Ishiyama |
| 7,179,549 B2 | 2/2007 | Malhotra et al. |
| 7,184,139 B2 | 2/2007 | Treves et al. |
| 7,196,860 B2 | 3/2007 | Alex |
| 7,199,977 B2 | 4/2007 | Suzuki et al. |
| 7,208,236 B2 | 4/2007 | Morikawa et al. |
| 7,211,156 B2 | 5/2007 | Yamaguchi et al. |
| 7,220,500 B1 | 5/2007 | Tomiyasu et al. |
| 7,229,266 B2 | 6/2007 | Harper |
| 7,239,970 B2 | 7/2007 | Treves et al. |
| 7,252,897 B2 | 8/2007 | Shimokawa et al. |
| 7,277,254 B2 | 10/2007 | Shimokawa et al. |
| 7,281,920 B2 | 10/2007 | Homola et al. |
| 7,292,329 B2 | 11/2007 | Treves et al. |
| 7,301,726 B1 | 11/2007 | Suzuki |
| 7,302,148 B2 | 11/2007 | Treves et al. |
| 7,305,119 B2 | 12/2007 | Treves et al. |
| 7,314,404 B2 | 1/2008 | Singh et al. |
| 7,320,584 B1 | 1/2008 | Harper et al. |
| 7,329,114 B2 | 2/2008 | Harper et al. |
| 7,375,362 B2 | 5/2008 | Treves et al. |
| 7,420,886 B2 | 9/2008 | Tomiyasu et al. |
| 7,425,719 B2 | 9/2008 | Treves et al. |
| 7,471,484 B2 | 12/2008 | Wachenschwanz et al. |
| 7,485,611 B2 | 2/2009 | Roeder et al. |
| 7,498,062 B2 | 3/2009 | Calcaterra et al. |
| 7,531,485 B2 | 5/2009 | Hara et al. |
| 7,537,846 B2 | 5/2009 | Ishiyama et al. |
| 7,549,209 B2 | 6/2009 | Wachenschwanz et al. |
| 7,553,803 B2 | 6/2009 | Korzenski et al. |
| 7,569,490 B2 | 8/2009 | Staud |
| 7,597,765 B2 | 10/2009 | Zhu et al. |
| 7,597,792 B2 | 10/2009 | Homola et al. |
| 7,597,973 B2 | 10/2009 | Ishiyama |
| 7,608,193 B2 | 10/2009 | Wachenschwanz et al. |
| 7,632,087 B2 | 12/2009 | Homola |
| 7,656,615 B2 | 2/2010 | Wachenschwanz et al. |
| 7,682,546 B2 | 3/2010 | Harper |
| 7,684,152 B2 | 3/2010 | Suzuki et al. |
| 7,686,606 B2 | 3/2010 | Harper et al. |
| 7,686,991 B2 | 3/2010 | Harper |
| 7,695,833 B2 | 4/2010 | Ishiyama |
| 7,722,968 B2 | 5/2010 | Ishiyama |
| 7,733,605 B2 | 6/2010 | Suzuki et al. |
| 7,736,768 B2 | 6/2010 | Ishiyama |
| 7,755,861 B1 | 7/2010 | Li et al. |
| 7,758,732 B1 | 7/2010 | Calcaterra et al. |
| 7,833,639 B2 | 11/2010 | Sonobe et al. |
| 7,833,641 B2 | 11/2010 | Tomiyasu et al. |
| 7,910,159 B2 | 3/2011 | Jung |
| 7,911,736 B2 | 3/2011 | Bajorek |
| 7,924,519 B2 | 4/2011 | Lambert |
| 7,944,165 B1 | 5/2011 | O'Dell |
| 7,944,643 B1 | 5/2011 | Jiang et al. |
| 7,955,723 B2 | 6/2011 | Umezawa et al. |
| 7,983,003 B2 | 7/2011 | Sonobe et al. |
| 7,993,497 B2 | 8/2011 | Moroishi et al. |
| 7,993,765 B2 | 8/2011 | Kim et al. |
| 7,998,912 B2 | 8/2011 | Chen et al. |
| 8,002,901 B1 | 8/2011 | Chen et al. |
| 8,003,237 B2 | 8/2011 | Sonobe et al. |
| 8,012,920 B2 | 9/2011 | Shimokawa |
| 8,034,185 B2 | 10/2011 | Liu et al. |
| 8,038,863 B2 | 10/2011 | Homola |
| 8,057,926 B2 | 11/2011 | Ayama et al. |
| 8,062,778 B2 | 11/2011 | Suzuki et al. |
| 8,064,156 B1 | 11/2011 | Suzuki et al. |
| 8,076,013 B2 | 12/2011 | Sonobe et al. |
| 8,092,931 B2 | 1/2012 | Ishiyama et al. |
| 8,100,685 B1 | 1/2012 | Harper et al. |
| 8,101,054 B2 | 1/2012 | Chen et al. |
| 8,118,945 B2 | 2/2012 | Eitoku |
| 8,125,723 B2 | 2/2012 | Nichols et al. |
| 8,125,724 B1 | 2/2012 | Nichols et al. |
| 8,137,517 B1 | 3/2012 | Bourez |
| 8,142,916 B2 | 3/2012 | Umezawa et al. |
| 8,163,093 B1 | 4/2012 | Chen et al. |
| 8,171,949 B2 | 5/2012 | Lund et al. |
| 8,173,282 B1 | 5/2012 | Sun et al. |
| 8,178,480 B2 | 5/2012 | Hamakubo et al. |
| 8,206,789 B2 | 6/2012 | Suzuki |
| 8,218,260 B2 | 7/2012 | Iamratanakul et al. |
| 8,247,095 B2 | 8/2012 | Champion et al. |
| 8,257,783 B2 | 9/2012 | Suzuki et al. |
| 8,298,609 B1 | 10/2012 | Liew et al. |

(56) References Cited

U.S. PATENT DOCUMENTS

| | | | |
|---|---|---|---|
| 8,298,689 B2 | 10/2012 | Sonobe et al. |
| 8,309,239 B2 | 11/2012 | Umezawa et al. |
| 8,316,668 B1 | 11/2012 | Chan et al. |
| 8,331,056 B2 | 12/2012 | O'Dell |
| 8,354,618 B1 | 1/2013 | Chen et al. |
| 8,367,228 B2 | 2/2013 | Sonobe et al. |
| 8,383,209 B2 | 2/2013 | Ayama |
| 8,394,243 B1 | 3/2013 | Jung et al. |
| 8,397,751 B1 | 3/2013 | Chan et al. |
| 8,399,809 B1 | 3/2013 | Bourez |
| 8,402,638 B1 | 3/2013 | Treves et al. |
| 8,404,056 B1 | 3/2013 | Chen et al. |
| 8,404,369 B2 | 3/2013 | Ruffini et al. |
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,517,364 B1 | 8/2013 | Crumley et al. |
| 8,517,657 B2 | 8/2013 | Chen et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'Im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 8,696,404 B2 | 4/2014 | Sun et al. |
| 8,711,499 B1 | 4/2014 | Desai et al. |
| 8,743,666 B1 | 6/2014 | Bertero et al. |
| 8,758,912 B2 | 6/2014 | Srinivasan et al. |
| 8,787,124 B1 | 7/2014 | Chernyshov et al. |
| 8,787,130 B1 | 7/2014 | Yuan et al. |
| 8,791,391 B2 | 7/2014 | Bourez |
| 8,795,765 B2 | 8/2014 | Koike et al. |
| 8,795,790 B2 | 8/2014 | Sonobe et al. |
| 8,795,857 B2 | 8/2014 | Ayama et al. |
| 8,800,322 B1 | 8/2014 | Chan et al. |
| 8,811,129 B1 | 8/2014 | Yuan et al. |
| 8,817,410 B1 | 8/2014 | Moser et al. |
| 8,828,183 B2 | 9/2014 | Namba et al. |
| 8,920,567 B2 | 12/2014 | Devarapalli et al. |
| 2002/0060883 A1 | 5/2002 | Suzuki |
| 2002/0157199 A1 | 10/2002 | Piltingsrud |
| 2003/0022024 A1 | 1/2003 | Wachenschwanz |
| 2004/0022387 A1 | 2/2004 | Weikle |
| 2004/0132301 A1 | 7/2004 | Harper et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0036223 A1 | 2/2005 | Wachenschwanz et al. |
| 2005/0133066 A1 | 6/2005 | Takahashi |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0263401 A1 | 12/2005 | Olsen et al. |
| 2006/0130874 A1 | 6/2006 | Lee et al. |
| 2006/0147758 A1 | 7/2006 | Jung et al. |
| 2006/0181697 A1 | 8/2006 | Treves et al. |
| 2006/0207890 A1 | 9/2006 | Staud |
| 2007/0014915 A1 | 1/2007 | Nishiura et al. |
| 2007/0070549 A1 | 3/2007 | Suzuki et al. |
| 2007/0245909 A1 | 10/2007 | Homola |
| 2008/0075845 A1 | 3/2008 | Sonobe et al. |
| 2008/0093760 A1 | 4/2008 | Harper et al. |
| 2009/0000649 A1 | 1/2009 | Lee |
| 2009/0117408 A1 | 5/2009 | Umezawa et al. |
| 2009/0136784 A1 | 5/2009 | Suzuki et al. |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0311557 A1 | 12/2009 | Onoue et al. |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0227202 A1* | 9/2010 | Gao et al. .......... 428/848.2 |
| 2010/0232065 A1 | 9/2010 | Suzuki et al. |
| 2010/0247965 A1 | 9/2010 | Onoue |
| 2010/0261039 A1 | 10/2010 | Itoh et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0097603 A1 | 4/2011 | Onoue |
| 2011/0097604 A1 | 4/2011 | Onoue |
| 2011/0139188 A1 | 6/2011 | Tsai et al. |
| 2011/0171495 A1 | 7/2011 | Tachibana et al. |
| 2011/0206947 A1 | 8/2011 | Tachibana et al. |
| 2011/0212346 A1 | 9/2011 | Onoue et al. |
| 2011/0223446 A1 | 9/2011 | Onoue et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0069466 A1 | 3/2012 | Okamoto et al. |
| 2012/0070692 A1 | 3/2012 | Sato et al. |
| 2012/0077060 A1 | 3/2012 | Ozawa |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |

(56) References Cited

U.S. PATENT DOCUMENTS

| | | |
|---|---|---|
| 2012/0308722 A1 | 12/2012 | Suzuki et al. |
| 2013/0040167 A1 | 2/2013 | Alagarsamy et al. |
| 2013/0071694 A1 | 3/2013 | Srinivasan et al. |
| 2013/0084386 A1 | 4/2013 | Yamaguchi et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |
| 2014/0044992 A1 | 2/2014 | Onoue |
| 2014/0050843 A1 | 2/2014 | Yi et al. |
| 2014/0151360 A1 | 6/2014 | Landdell et al. |
| 2014/0234666 A1 | 8/2014 | Knigge et al. |
| 2014/0318578 A1 | 10/2014 | Enicks et al. |

\* cited by examiner

ACIDIC POST-SPUTTER WASH FOR MAGNETIC RECORDING MEDIA

BACKGROUND

A hard-disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. Write heads make use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

Increasing areal density (a measure of the quantity of information bits that can be stored on a given area of disk surface) is one of the ever-present goals of hard disk drive design evolution. As areal density increases, the read-write head generally needs to fly closer and closer to the disk surface. Likewise, as the read-write head flies closer to the disk surface, unwanted head-disk interactions (e.g., a "crash") are more likely to take place. Furthermore, because modern HDDs fly the head so very close to the disk surface, the presence of surface contaminants on either the head and/or the disk can increase the likelihood of head-disk crashes.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a post-magnetic layer deposition wash process for a magnetic recording medium are described. In the following description, for the purposes of explanation, numerous specific details are set forth in order to provide a thorough understanding of the embodiments described herein. It will be apparent, however, that the embodiments described herein may be practiced without these specific details. In other instances, well-known structures and devices are shown in block diagram form in order to avoid unnecessarily obscuring the embodiments described herein.

Physical Description of Illustrative Operating Environments

Embodiments may be used in the context of a magnetic recording medium in a hard-disk drive (HDD) data storage device. Thus, in accordance with an embodiment, a plan view illustrating an HDD 100 is shown in FIG. 1 to illustrate an examplary operating environment.

Figure 1:
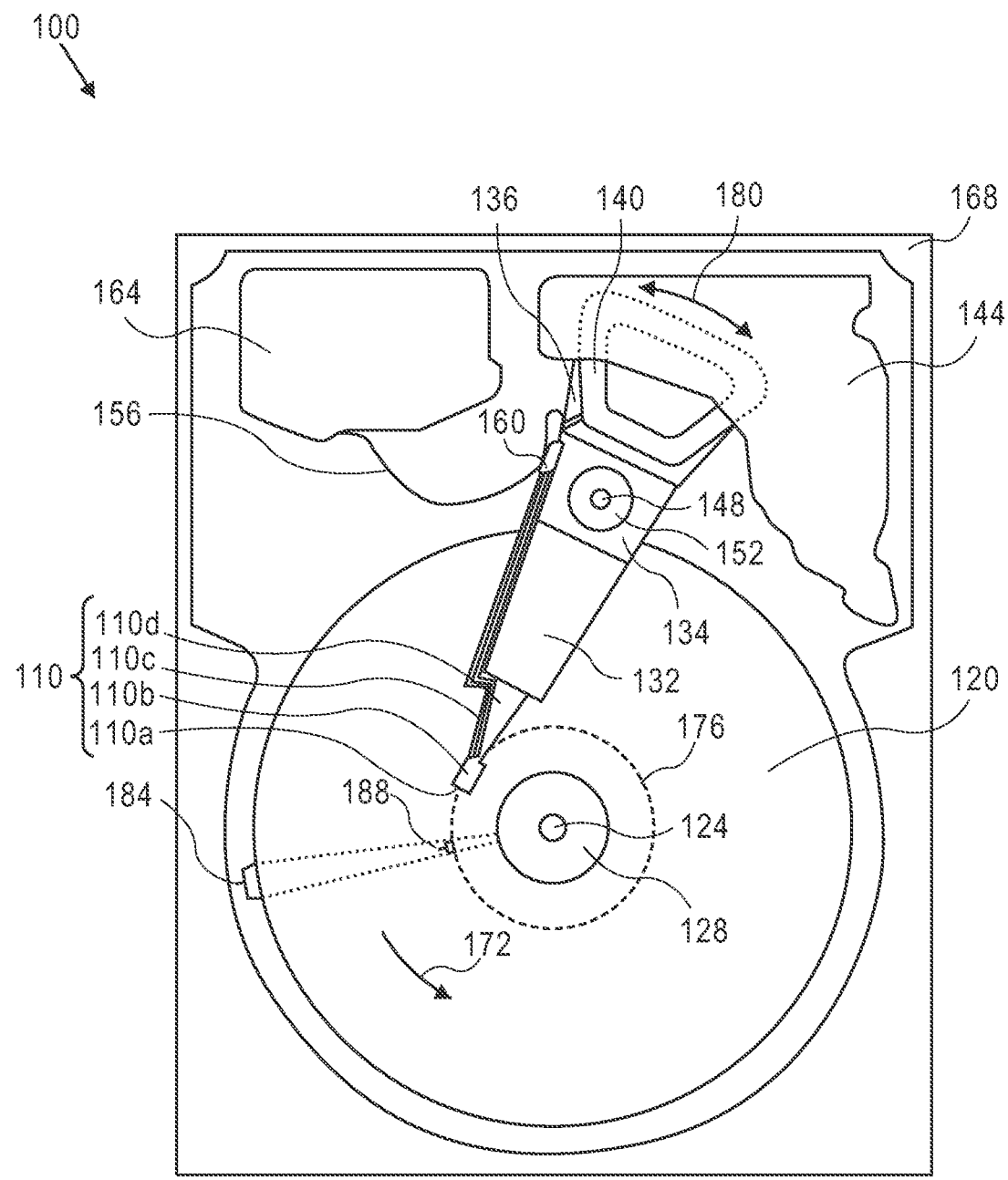
FIG. 1 is a plan view illustrating a hard disk drive, according to an embodiment.

FIG. 1 illustrates the functional arrangement of components of the HDD 100 including a slider 110b that includes a magnetic-reading/recording head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one magnetic-recording medium 120 rotatably mounted on a spindle 124 and a drive motor (not visible) attached to the spindle 124 for rotating the medium 120. The head 110a includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110, to access portions of the medium 120, being mounted on a pivot-shaft 148 with an interposed pivot-bearing assembly 152. In the case of an HDD having multiple disks, the carriage 134 is called an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are provided by a flexible interconnect cable 156 ("flex cable"). Interconnection between the flex cable 156 and the head 110a may be provided by an arm-electronics (AE) module 160, which may have an on-board pre-amplifier for the read signal, as well as other read-channel and write-channel electronic components. The AE 160 may be attached to the carriage 134 as shown. The flex cable 156 is coupled to an electrical-connector block 164, which provides electrical communication through electrical feedthroughs provided by an HDD housing 168. The HDD housing 168, also referred to as a base, in conjunction with an HDD cover provides a sealed, protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector"), for example, sectored track portion 188. Each sectored track portion 188 may be composed of recorded data and a header containing a servo-burst-signal pattern, for example, an ABCD-servo-burst-signal pattern, which is information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

Introduction

As discussed, the presence of surface contaminants on a magnetic recording medium (e.g., a magnetic recording disk) can increase the likelihood of head-disk crashes. For example, cobalt (Co) particles diffusing up from the magnetic recording layer(s) may ultimately become magnetic contaminants on the outer surface of the recording disk. Therefore, the magnetic recording disk surface is typically cleaned to minimize surface contaminants. However, it has been found that, due to the electronegativity of nitrogen associated with a nitrogenated carbon overcoat on the outer surface of the media, even with surface cleaning dissolved metallic ions (e.g., $Co^{2+}$) are attracted to and can adsorb onto the media surface during a post sputter wash (PSW) process. Cobalt contamination levels on media have been linked to lube pick-up and touch down power changes in hard disks drives and, therefore, minimizing magnetic contamination levels on media can improve hard disk drive reliability.

For particle reduction purposes, magnetic recording disks may be post-sputter washed (PSW) in deionized water and then dried shortly after exiting the sputter system. However, it has been found that the PSW process could lead to higher cobalt contamination if there is a prolonged waiting time between sputter and PSW processes (this delay is referred to as "WIP time"). Controlling WIP times is not always practical or even possible in production due to equipment availability issues, for example.

Furthermore, the cobalt adsorption mechanism may be more prominent when the sputtered magnetic disks are exposed to the production environment, whereby organic contaminants such as phthalates, chelating with $Co^{2+}$ in PSW water tanks, lead to higher cobalt adsorption. Storing disks in a fully enclosed chamber between sputter and PSW has been shown to eliminate the WIP time dependence of cobalt contamination. However, this is not practical for all production lines, and it would be an expensive modification to the conveyors used to transport the disks from sputter to PSW, or a significant cost of additional labor to move disks into enclosures after sputter and to remove the disks from enclosures immediately before PSW.

Method of Manufacturing Magnetic Recording Media

Figure 2:
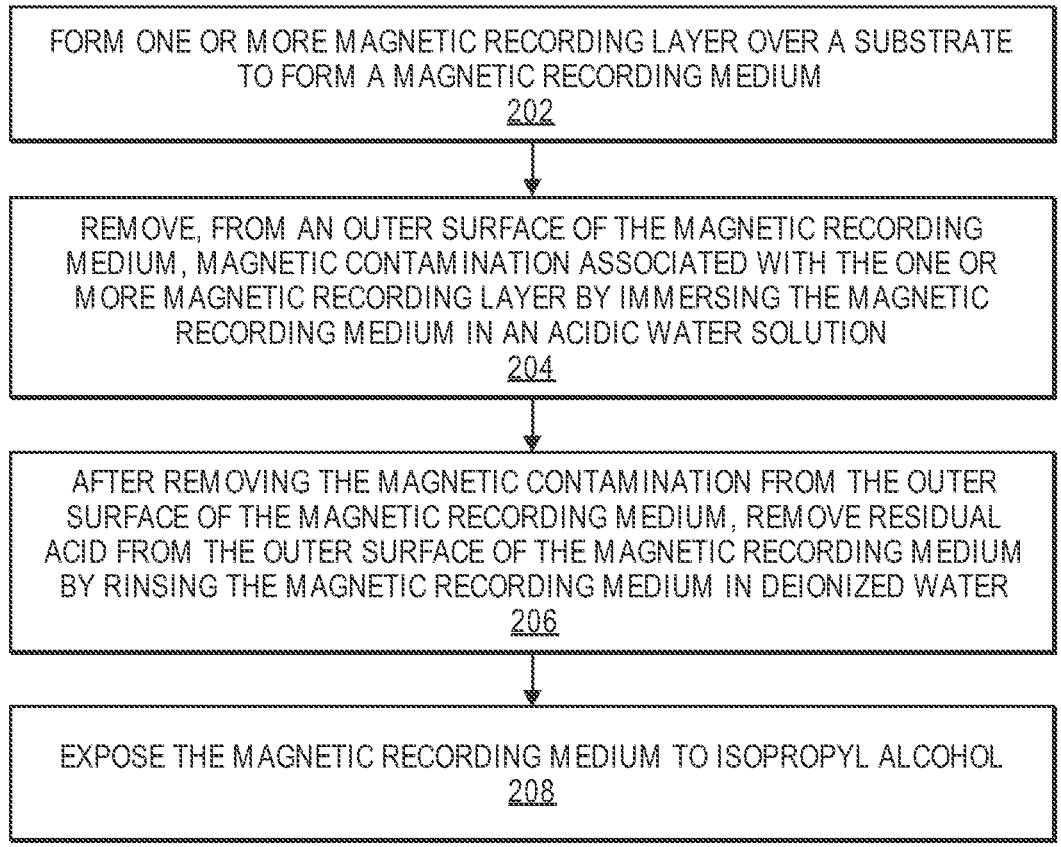
FIG. 2 is a flow diagram illustrating a method of manufacturing a magnetic recording medium, according to an embodiment.

FIG. 2 is a flow diagram illustrating a method of manufacturing a magnetic recording medium, according to an embodiment.

At block 202, one or more magnetic recording layer is formed over a substrate, to form a magnetic recording medium. For example, one or more layers of magnetic material containing cobalt are deposited over a substrate. Depending on the type of medium being fabricated, numerous and various underlayers, exchange break layers, overcoats, and the like, which are not the focus of embodiments described herein, may also be formed over the substrate before and/or after forming the one or more magnetic recording layer.

Reference herein to a "layer" is not intended to be thereby limited to a single layer, rather each "layer" referenced may actually comprise multiple layers, or a "stack" of thin film layers. Further, the terms "fabricated" and "formed" may include any of a number of thin film processes, such as chemical and/or physical deposition processes (of which sputtering is commonly used in hard disk media production), which "grow" grains of poly-crystalline thin films, for example, as well as may promote crystalline epitaxial growth, and the like. Therefore, use of these terms and related terms do not limit to any particular process, unless otherwise indicated.

According to one embodiment, the act of forming one or more magnetic layer at block 202 includes performing a sputter deposition process to form the magnetic layer(s). According to a related embodiment, the act of forming one or more magnetic layer at block 202 includes performing a sputter deposition process of a cobalt-based magnetic material to form the magnetic layer(s).

At block 204, magnetic contamination associated with the one or more magnetic recording layer is removed from the outer surface of the magnetic recording medium by immersing the medium in an acidic water solution. Recall that cobalt particles (or other magnetic material particles) diffusing up from the magnetic recording layer(s) may ultimately become magnetic contaminants on the outer surface of the recording disk, and that even when a post-sputter wash (PSW) process is utilized, dissolved metallic ions (e.g., $Co^{2+}$) can adsorb onto media surface during the PSW process. According to an embodiment, the act of removing magnetic contaminants includes removing cobalt particles from the surface of the medium.

By reducing the pH of the water in the PSW water tank, cobalt adsorption can be reduced. Such reduction of cobalt adsorption on the surface of the magnetic recording medium may be based at least in part by operation of the standard electro potential associated with cobalt. Furthermore, the acidity in the PSW water tanks promotes metallic contaminants to dissolve.

According to an embodiment, the act of removing the magnetic contamination by immersing the magnetic recording medium in an acidic water solution at block 204 includes immersing the medium in a water solution having a pH less than around 5.0, an acidic level found to be effective for the purpose of removing such magnetic contaminants. Viable candidates for modifying the pH of the deionized water used in the PSW tank for the foregoing purpose include use of a diluted "strong" acid such as nitric acid ($HNO_3$) and a "weak" acid such as carbonic acid ($H_2CO_3$). Thus, according to an embodiment, prior to immersing the magnetic recording medium at block 204, a mild acid is introduced into a deionized water source, where the mild acid comprises around a 2% or lower pre-diluted nitric acid.

Similarly, according to another embodiment, prior to immersing the magnetic recording medium at block 204, a mild acid is introduced into a deionized water source, where the mild acid comprises a carbonic acid. Note that when water is exposed to air, a low concentration of $CO_2$ naturally dissolves in the water. Hence, deionized water is usually slightly acidic, having a weak carbonic acid component. This leads to a pH ranging between 5.5 and 6.5 depending on temperature, agitation and time of exposure. However, the use of an acidic water solution at block 204 is not intended to fall within such a pH range that occurs naturally when water is exposed to the $CO_2$ in air. A higher carbonic acid content corresponding to lower pH can be achieved via other means, which are described in more detail in reference to FIG. 4.

Magnetic recording media production typically further comprises forming an overcoat over the magnetic recording layer(s), at least in part to protect the layers of metals and possibly other materials lying under the overcoat layer. For a non-limiting example, a nitrogenated carbon overcoat may be formed over the magnetic recording layer(s) and any subsequent layers (if any). According to an embodiment, it is this outer overcoat surface from which the magnetic contamination is removed at block 204. Thus, a magnetic recording medium subjected to the foregoing wash process could and may exhibit an outer surface, e.g., the overcoat surface, that is substantially free of magnetic particulates. For example, the outer surface of a magnetic recording medium may have less than around 28 $pg/cm^2$ of Co, e.g., just after fabrication and early in the HDD lifecycle. For one non-limiting but practical example, a mean cobalt level of around 23 $pg/cm^2$, having a standard deviation of around 2 $pg/cm^2$, was achieved for a set of over 250 magnetic recording disks by using a mildly acidic deionized water post-sputter wash as described herein. Cobalt levels are known to be higher for magnetic recording disks with thinner carbon overcoats and higher nitrogen levels. Thus, it was investigated and found that the cobalt levels are systematically reduced after acidic PSW, for all carbon thicknesses and nitrogen levels within the normal range of production.

Furthermore and according to an embodiment, additional magnetic contamination may be removed from the magnetic recording medium by immersing the medium in a second acidic water solution, after immersing the medium in the acidic water solution at block 204.

With the foregoing process, the deposition of layers can be performed using a variety of deposition sub-processes, for non-limiting examples, physical vapor deposition (PVD), sputter deposition and ion beam deposition, and chemical vapor deposition (CVD) including plasma enhanced chemical vapor deposition (PECVD), low pressure chemical vapor deposition (LPCVD) and atomic layer chemical vapor deposition (ALCVD). Furthermore, other suitable deposition techniques known in the art may also be used.

Figure 3:
FIG. 3 is a diagram illustrating a post-sputter wash (PSW) process, according to an embodiment.

FIG. 3 is a diagram illustrating a post-sputter wash (PSW) process, according to an embodiment. Blocks 302-306 are generally referred to herein as a series of "tanks". A mildly acidic DIW tank 302 facilitates immersing the magnetic recording medium in a mildly acidic water solution (e.g., block 204 of FIG. 2), such as a deionized water-diluted nitric acid solution or a deionized water-carbonic acid solution.

Returning to FIG. 2, at optional block 206, after removing magnetic contamination from the surface of the magnetic recording medium at block 204, residual acid is removed from the magnetic recording medium by rinsing the medium in deionized water ("DI water"). Thus, block 206 generally corresponds to DI water tank 304 of FIG. 3, which refers to a second wash, or rinse, of the magnetic recording medium in DI water. This rinse is performed in un-augmented deionized water, i.e., one in which nitric or carbonic acids are not directly or intentionally introduced.

With further reference to FIG. 2, at optional block 208 the magnetic recording medium is exposed to isopropyl alcohol ("IPA"). Such exposure to IPA may be implemented, for example, as an IPA immersion of the medium (possible including an ultrasonic mechanism to facilitate particle removal) and then to an IPA vapor tank to expose the medium to IPA vapor. The primary purpose for exposing the magnetic recording medium to IPA is to remove residual water/moisture on the medium from the DI water tank 304 (FIG. 3). Another approach to exposing the magnetic recording medium to IPA at optional block 208 may be, for example, immersing the medium in a solution of DI water, $N_2$ and IPA. In either example scenario, block 208 generally corresponds to dryer tank 306 of FIG. 3.

Figure 4:
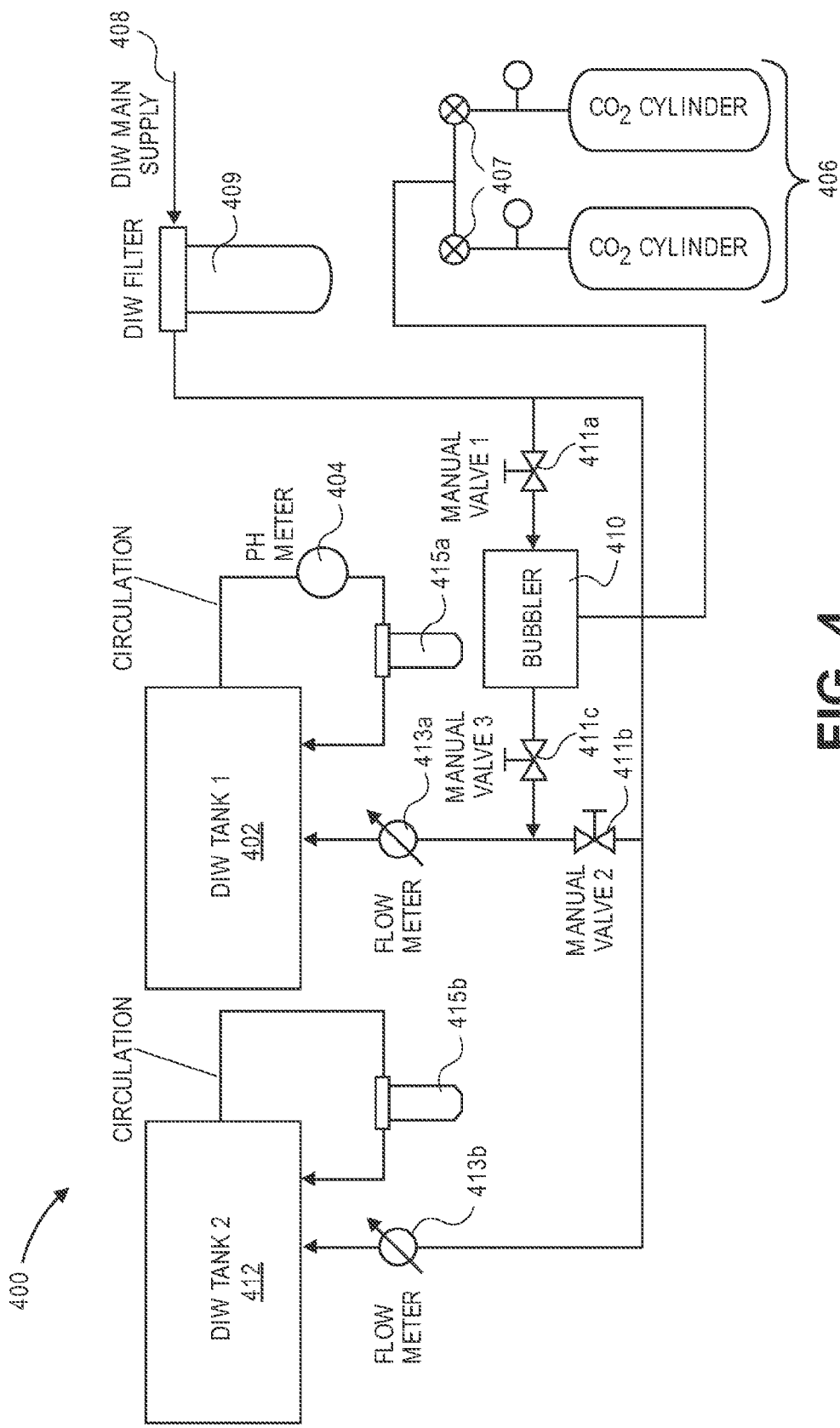
FIG. 4 is a diagram illustrating an example setup for a PSW process, according to an embodiment.

FIG. 4 is a diagram illustrating an example setup for a post-sputter wash (PSW) process, according to an embodiment. The PSW process setup exemplified in FIG. 4 may be used to perform part of the method of manufacturing described in reference to FIG. 2. However, FIG. 4 refers solely to the PSW process and does not include tooling for the deposition processes, such as magnetic recording layer formation, overcoat formation, and the like. Furthermore, FIG. 4 depicts but one non-limiting approach to a PSW process setup, i.e., an example. Thus, a PSW process setup for practicing embodiments described herein may vary from implementation to implementation and may, therefore, vary from the setup depicted in FIG. 4.

PSW setup 400 comprises a first deionized water (DIW) tank 402 and a second deionized water (DIW) tank 412. PSW setup 400 further comprises a DIW main supply line 408 which flows DIW through a DIW filter 409. From the DIW filter 409, filtered DIW flows through a flow meter 413$b$ corresponding to the DIW tank 412 (e.g., DIW water tank 304 of FIG. 3) and hence into the DIW tank 412. A filter 415$b$ is also associated with a circulation flow for DIW tank 412.

Furthermore, from the DIW filter 409, filtered DIW flows to and/or through a valve 411$b$ and onward through a flow meter 413$a$ corresponding to the DIW tank 402 (e.g., mildly acidic DIW tank 302 of FIG. 3) and hence into the DIW tank 402. The DIW flowing through the valve 411$b$ may be mixed with mildly acidic DIW flowing through the valve 411$c$, described in more detail herein.

This particular example setup illustrated in FIG. 4 is applicable to a PSW process that utilizes a carbonic acid wash. One non-limiting, practical approach to introducing carbonic acid into the DIW tank 402 is by using resistivity equipment 410 (e.g., a "bubbler") for injecting $CO_2$ gas into DI water. In the example PSW setup 400, the resistivity equipment 410 is fed $CO_2$ gas by one or more $CO_2$ cylinder 406, controlled by a valve controller 407. Thus, $CO_2$ flows to the resistivity equipment 410 while DI water flows from the DIW filter 409 through the valve 411a and through the resistivity equipment 410, where the DI water is "carbonic acidized". The mild carbonic acid impregnated water can then flow on through valve 411c (possibly mix with DIW flowing through valve 411b) and onward through the flow meter 413a and into DIW tank 402. A pH meter 404 and a filter 415a are also associated with a circulation flow for DIW tank 402. Process knobs such as $CO_2$ gas pressure adjustment, and DIW flow rate through the eFlow, can be used to maintain a certain desired pH for the DI water in DIW tank 402, which can be monitored by the pH meter 404.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A method of manufacturing a magnetic recording medium, the method comprising:
    forming one or more magnetic recording layer over a substrate to form a magnetic recording medium; and
    removing, from an outer surface of said magnetic recording medium, magnetic contamination associated with said one or more magnetic recording layer by immersing said magnetic recording medium in an acidic water solution.

2. The method of claim 1, wherein said forming includes performing a sputter deposition process, and wherein said removing includes removing cobalt particle contaminants from said outer surface of said magnetic recording medium.

3. The method of claim 1, wherein said immersing includes immersing said magnetic recording medium in a water solution having a pH less than around 5.

4. The method of claim 1, further comprising:
    prior to said immersing, introducing a mild acid into a deionized water source, wherein said mild acid comprises around a 2% or lower pre-diluted nitric acid.

5. The method of claim 1, further comprising:
    prior to said immersing, introducing a mild acid into a deionized water source, wherein said mild acid comprises a carbonic acid.

6. The method of claim 1, further comprising:
    after removing said magnetic contamination from said outer surface of said magnetic recording medium, removing residual acid from said outer surface of said magnetic recording medium by rinsing said magnetic recording medium in deionized water.

7. The method of claim 6, further comprising:
    exposing said magnetic recording medium to isopropyl alcohol.

8. The method of claim 1, wherein said immersing comprises immersing in a first acidic water solution, the method further comprising:
    further removing magnetic contamination from said outer surface of said magnetic recording medium by immersing said magnetic recording medium in a second acidic water solution after immersing in said first acidic water solution.

9. A magnetic recording medium prepared by a process comprising:
    forming one or more magnetic recording layer over a substrate;
    forming an overcoat over said one or more magnetic recording layer, thereby forming an unfinished magnetic recording medium; and
    removing, from an outer surface of said unfinished magnetic recording medium, magnetic contamination associated with said one or more magnetic recording layer by immersing said magnetic recording medium in an acidic water solution, thereby forming a finished magnetic recording medium;
    wherein said outer surface of said finished magnetic recording medium is substantially free of magnetic particulates on said overcoat.

10. The magnetic recording medium of claim 9, wherein said forming one or more magnetic recording layer comprises performing a sputter deposition process, and wherein said removing includes removing cobalt particle contaminants from said outer surface of said magnetic recording medium.

11. The magnetic recording medium of claim 9, wherein said immersing includes immersing said magnetic recording medium in a water solution having a pH less than around 5.

12. The magnetic recording medium of claim 9, wherein said acidic water solution comprises a solution of around 2% or lower pre-diluted nitric acid with deionized water.

13. The magnetic recording medium of claim 9, wherein said acidic water solution comprises a solution of carbonic acid with deionized water.

14. The magnetic recording medium of claim 9, the preparation process further comprising:
    exposing said finished magnetic recording medium to isopropyl alcohol.

15. A data storage device comprising:
    a magnetic recording medium rotatably mounted on a spindle, said magnetic recording medium prepared by a process comprising:
        forming one or more magnetic recording layer over a substrate;
        forming an overcoat over said one or more magnetic recording layer, thereby forming an unfinished magnetic recording medium; and
        removing, from an outer surface of said unfinished magnetic recording medium, magnetic contamination associated with said one or more magnetic recording layer by immersing said magnetic recording medium in an acidic water solution, thereby forming a finished magnetic recording medium;

wherein said outer surface of said finished magnetic recording medium is substantially free of magnetic particulates on said overcoat;

a read-write head slider configured to read from and to write to said magnetic recording medium; and a voice coil actuator configured to move said head slider to access portions of said magnetic recording medium.

16. The data storage device of claim 15, wherein said forming one or more magnetic recording layer comprises performing a sputter deposition process, and wherein said removing includes removing cobalt particle contaminants from said outer surface of said magnetic recording medium.

17. The data storage device of claim 15, wherein said immersing includes immersing said magnetic recording medium in a water solution having a pH less than around 5.

18. The data storage device of claim 15, wherein said acidic water solution comprises a solution of around 2% or lower pre-diluted nitric acid with deionized water.

19. The data storage device of claim 15, wherein said acidic water solution comprises a solution of carbonic acid with deionized water.

20. The data storage device of claim 15, the preparation process further comprising:

after removing said magnetic contamination from said outer surface of said magnetic recording medium, removing residual acid from said outer surface of said magnetic recording medium by rinsing said magnetic recording medium in deionized water; and exposing said magnetic recording medium to isopropyl alcohol.

\* \* \* \* \*